United States Patent [19]

Costrini et al.

[11] Patent Number: 4,933,302

[45] Date of Patent: Jun. 12, 1990

[54] FORMATION OF LASER MIRROR FACETS AND INTEGRATION OF OPTOELECTRONICS

[75] Inventors: Gregory Costrini, Brewster; Chakrapani G. Jambotkar, Hopewell Junction, both of N.Y.

[73] Assignee: International Business Machines Corporation, Armonk, N.Y.

[21] Appl. No.: 340,195

[22] Filed: Apr. 19, 1989

[51] Int. Cl.$^5$ .................. H01L 21/20; H01L 21/205
[52] U.S. Cl. .......................... 437/129; 148/DIG. 26; 148/DIG. 95; 148/DIG. 106; 357/17; 372/46; 437/90; 437/133
[58] Field of Search .................. 148/DIG. 26, 50, 56, 148/65, 72, 95, 106, 169; 357/16, 17, 55; 372/45, 46, 50; 437/81, 89, 90, 126, 129, 133, 225, 228, 905

[56] References Cited

U.S. PATENT DOCUMENTS

| | | | |
|---|---|---|---|
| 4,054,363 | 10/1977 | Suematsu | 372/50 |
| 4,230,997 | 10/1980 | Hartman et al. | 372/46 |
| 4,348,763 | 9/1982 | Ackley et al. | 372/46 |
| 4,440,841 | 4/1984 | Tabuchi | 430/5 |
| 4,503,540 | 3/1985 | Nakashima et al. | 372/47 |
| 4,577,321 | 3/1986 | Carney et al. | 372/50 |
| 4,644,553 | 2/1987 | Van Ruyven et al. | 357/17 |
| 4,694,460 | 9/1987 | Hayakawa et al. | 372/45 |
| 4,791,647 | 12/1988 | Sugon | 372/45 |
| 4,839,308 | 6/1989 | Fye | 437/129 |

FOREIGN PATENT DOCUMENTS

| | | | |
|---|---|---|---|
| 0115087 | 9/1979 | Japan | 372/46 |
| 0080195 | 7/1981 | Japan | 372/46 |
| 0207387 | 12/1982 | Japan . | |
| 0093689 | 5/1984 | Japan | 372/46 |
| 0222988 | 12/1984 | Japan | 372/46 |
| 0062175 | 4/1985 | Japan . | |
| 2098787 | 5/1987 | Japan | 372/46 |

OTHER PUBLICATIONS

IEEE Device Letters vol. EDL-5, No. 8 8/84–GaAs/- (Ga, Al) As Heterojunction Bipolar Transistors w/Buried Oxygen-Implanted Isolation Layers.
IEEE Electron device Ltrs, vol. EDL-5, No. 8, 8/84–GaAs/GaAlAs Selective MOCVD Epitaxy & Planar Ion-Implantation Technique for Comples Integrated.
Appl. Phys. Lett. 45(3), 1 Aug. '84–Monolithic integration of an InGaAsP/InP laser diode with heterojunction bipolar transistors.
Solid State Physics RC 11792 (#52958) 3/24/86–Transport & related properties of (Ga,Al)As/GaAs Double Heterostructure Bipolar Junction Transistors.
California Inst. of Tech., Pasadena, CA 91125–Whispering Gallery Lasers on Semi-Insulating GaAs Substrates, I. Ury, et al.

Primary Examiner—Brian E. Hearn
Assistant Examiner—William Bunch
Attorney, Agent, or Firm—Yen S. Yee; Donald M. Boles

[57] ABSTRACT

A planar process for fabricating an optoelectronic integrated circuit device is described. The process includes the in situ formation of laser diode mirror facets comprising the steps of providing a semi-insulating gallium arsenide substrate having thereon layers of n-doped gallium arsenide, n-doped aluminum gallium arsenide, and undoped gallium arsenide; patterning and etching the undoped gallium arsenide layer into a mandrel having substantially vertical walls; establishing insulator sidewalls on the vertical walls; removing the mandrel, thereby exposing the inner walls of the insulator sidewalls and leaving the insulator sidewalls self-standing; removing the aluminum gallium arsenide using the insulator sidewall as a mask; and forming a laser diode within the region between the insulator sidewalls and creating the mirror facets with the inner walls of the insulator sidewalls. Mirror facets formed in accordance with this process are substantially free of contaminants. The process is suitable for high level of monolithic integration, including the formation of other optical devices, such as waveguides, driver circuits, logic and other electronic circuits.

20 Claims, 2 Drawing Sheets

FORMATION OF LASER MIRROR FACETS AND INTEGRATION OF OPTOELECTRONICS

Technical Field

This invention relates generally to monolithically integrated optoelectronic devices and process for making same, and more particularly, to a planar process for an in situ formation of laser diode mirror facets.

Background Art

The high electron mobility and direct energy bandgap transition attributes of Gallium Arsenide (GaAs) are be promising for the realization of high speed electronic devices and efficient optical devices. An optoelectronic integrated circuit device monolithically integrating both optical devices and electronic circuits has been a goal and objective of recent active research activities. Such integration will substantially reduce parasitic impedances and will make possible low power, compact, and multi-function semiconductor devices having improved performance, reliability, and economy.

Generally, GaAs lasers of various structures and processes for forming same are known. However, many of these known laser structures and processes are subject to limitations, such processes being suitable for fabricating either a discrete device or only low level of integration. For instance, U.S. Pat. No. 4,530,540, issued Mar. 5, 1985 to H. Nakashima, et al entitled, "Phase-locked Semiconductor Laser Device" describes a semiconductor laser having a plurality of vertically arrayed active regions. A plurality of beams are generated by the laser device. The beams having a coherency of the same wavelength and the same phase as if the laser light is emitted from a single laser element. Similarly, U.S. Pat. No. 4,577,321 issued to J. K. Carney, entitled "Integrated Quantum Well Lasers for Wave Length Division Multiplexing" describes a laser structure which has a plurality of integrated quantum well laser for providing a plurality of light beams each having a different wavelength for use in wavelength division multiplexing.

Heretofore, semiconductor lasers employing a pair of mechanically cleaved mirror facets and processes for making same are well known. Such formation of mirror facets by mechanical cleaving requires excessive wafer handling and operator intervention which tend to introduce contaminants at the cleaved mirror facets. Furthermore, mechanical cleaving may also impose a lower limit on the cavity length dimensions of laser diode structures which could be reproduced reliably. An article entitled, "Optoelectronic Integrated Transmitter with a Micro-cleaved Facet Aluminum Gallium Arsenide/Gallium Arsenide Quantum Well Laser" by H. Nobuhara, et al, pages 650-653, Technical Digest, 1985 IEDM, IEEE, describes a laser device having a micro-cleaved facet and a process for making same. According to the article, after the formation of the laser heterostructure and the associated FET driver circuits, and as a final step of the fabrication process, the mirror facets of the laser device are formed by an etching process with an improved undercut etching procedure.

Many research efforts have been directed at fabricating a semiconductor device having monolithically integrated laser diodes, photomonitors, laser driver circuits, logic, and other electronic circuits. An article entitled, "Monolithic Integration of a Laser Diode, Photo Monitor, and Electric Circuit on a Semi-insulating GaAs Substrate", by H. Matsueda, et al., pages 779-781, Applied Optics Volume 23, Number 6, (March 1984), describes an optoelectronic device having a monolithically integrated laser diode, a photomonitor, and driver circuits. The described laser diode mirror facets were formed by creating a chemically etched groove after the laser diode structure was grown. The article recognizes that the fabrication of laser mirror facets is a challenging technical problem.

Still another article entitled, "Monolithic Integration of an InGaAsP/InP Laser Diode with Heterojunction Bipolar Transistors", by J. Shibata, et al., pages 191-193, Applied Physics Letter, Volume 45, No. 3, (August 1984), describes a monolithic integration of a buried heterostructure laser diode together with driving circuits based on heterostructure bipolar transistors (HBT's). The laser diode was fabricated in a conventional manner with the mirror facets formed thereafter in the creation of laser stripe by etching.

DISCLOSURE OF THE INVENTION

It is a principal object of the present invention to provide an improved method for fabricating mirror facets for a heterostructure laser diode.

Another principal object of the present invention is to provide a planar process for fabricating laser structures suitable for high level of monolithic integration of other optical devices, driver circuits, logic and other electronic circuits horizontally alongside.

It is generally an object of the present invention to provide an improved optoelectronic laser device.

A further object of the present invention is to provide a process suitable for and capable of fabricating small dimension laser structure with in situ formation of mirror facets.

It is yet another object of the present invention to provide a process for the formation of improved mirror facets with desirable optical quality and substantial freedom from contaminants.

These and other objects of the present invention will become apparent from the following more detailed description of a planar process for forming an optoelectronic device, including laser diode mirror facets, wherein the especially novel processing steps comprise: providing a semi-insulating gallium arsenide substrate having thereon layers of n-doped gallium arsenide, n-doped aluminum gallium arsenide and undoped gallium arsenide; patterning and etching said undoped gallium arsenide layer into a mandrel having substantially vertical walls; establishing insulator sidewalls on said vertical walls; removing said mandrel, thereby exposing the inner walls of said insulator sidewalls and leaving said insulator sidewalls self-standing; removing said aluminum gallium arsenide using said insulator sidewall as a mask; and forming a laser diode within the region between said insulator sidewalls and creating said mirror facets with said inner walls of said insulator sidewalls.

The nature, principle and utility of the present invention will be better understood from the hereinafter detailed description of the invention when read in conjunction with the accompanying drawings.

BRIEF DESCRIPTION OF THE DRAWINGS

Details of the invention will be described in connection with the accompanying drawings, in which.

BEST MODE FOR CARRYING OUT THE INVENTION

Figure 1E:
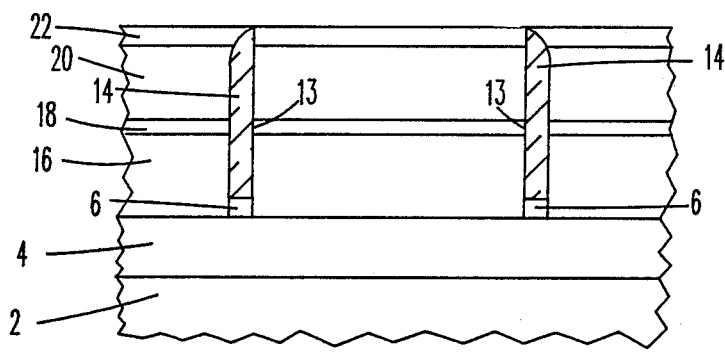
FIG. 1A–H are cross-sectional views of a portion of a laser diode device illustrating the steps in the fabrication of the device in accordance with the method of the present invention.
Figure 1F:
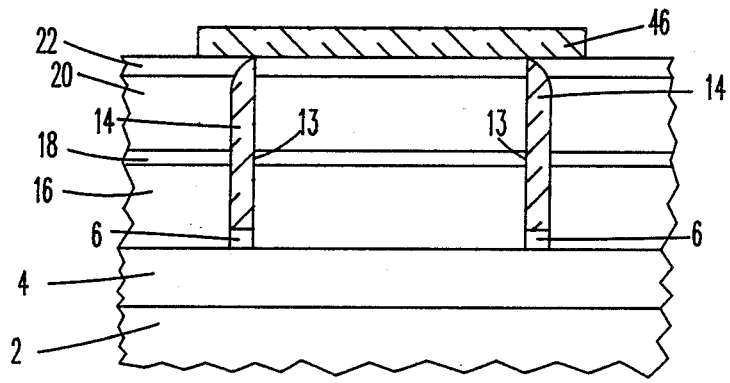
Figure 1G:
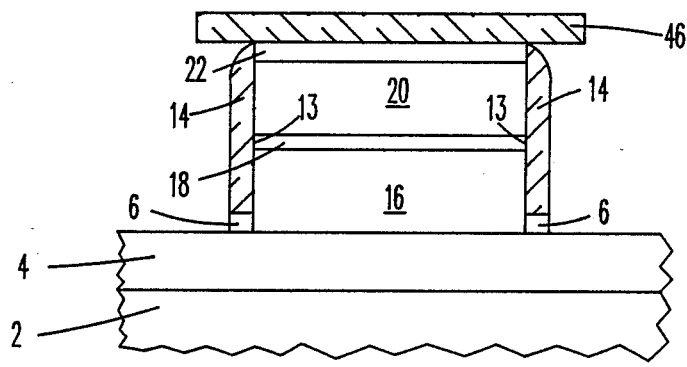

The present invention enables the fabrication of laser diode 1 with in situ formation of mirror facets 13 (See FIG. 1G). The present invention, including the in situ formation of mirror facets 13, makes possible the fabrication of high quality monolithic laser structures, and facilitates the monolithic integration of optoelectronic and electronic functions on the same semiconductor chip. In the hereinafter detailed description of an exemplary embodiment of the present invention, laser diode heterostructure is formed first, with mirror facets 13 being formed in situ substantially simultaneously, and then the fabrication of laser driver circuits, logic, and other electronic circuits, creating essentially a coplanar final structure on a monolithic semiconductor chip follows.

Figure 1H:
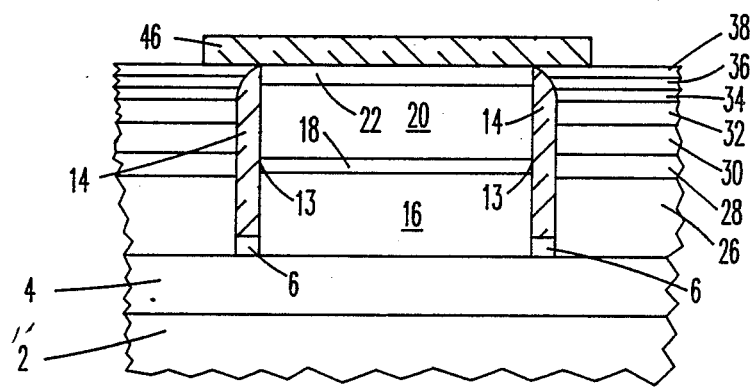
Figure 1A:
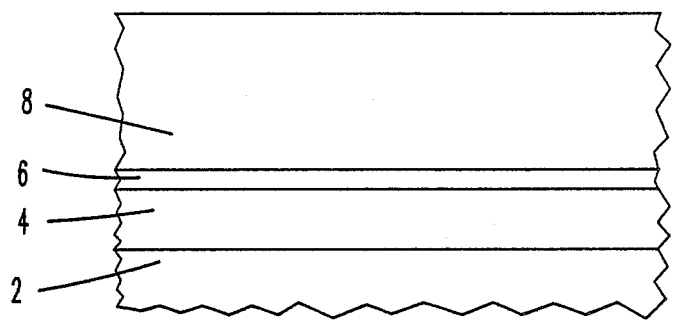

Referring to FIG. 1A, the preferred process in accordance with the present invention begins with a Gallium Arsenide (GaAs) semi-insulating substrate 2. A GaAs layer 4 of about 0.25 micron thickness and an n-type, silicon dopant concentration of about $2E18$ cm$^{-3}$ is deposited on substrate 2. Deposited on GaAs layer 4 is a thin Aluminum Gallium Arsenide (AlGaAs) layer 6 of about 0.025 micron thickness and an n-type, silicon dopant concentration preferably about $2E18$ cm$^{-3}$. An undoped GaAs layer 8 with a thickness of about 3.5 micron is then deposited on top of layer 6. Layers 4, 6 and 8 are preferably deposited by metalorganic chemical vapor deposition (MOCVD) or alternatively by molecular beam epitaxy (MBE).

Figure 1B:
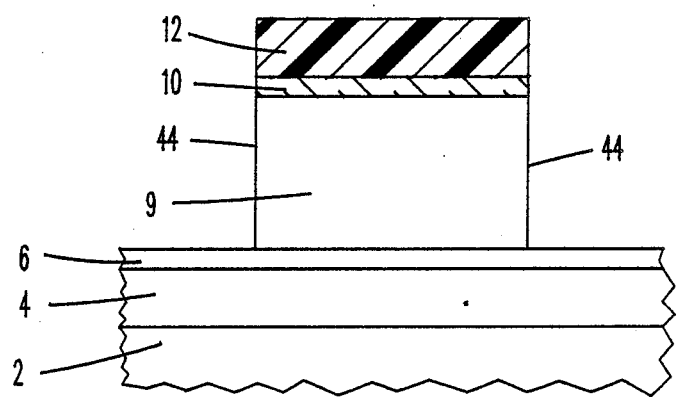

A SiO$_x$ layer 10 with an approximate thickness of 0.1 micron is then deposited on the layered structure of FIG. 1A by plasma enhanced chemical vapor deposition (PECVD). Deposited on top of layer 10 is a photoresist layer 12 with a thickness of approximately 1 micron. Photoresist layer 12 is then patterned by conventional photomasking and the SiO$_x$ layer 10 is etched by reactive ion etching (RIE) with CF$_4$. As illustrated in FIG. 1B of the preferred embodiment, the undoped layer 8 is then etched by RIE with CCl$_2$F$_2$ and He to form a mandrel 9 having substantial vertical walls 44 with the AlGaAs layer 6 acting as an etch stop.

Figure 1C:
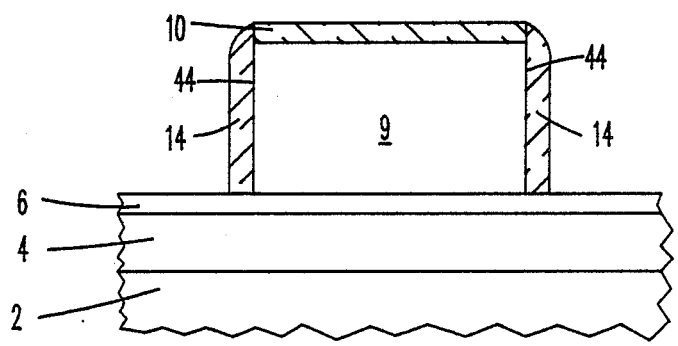

The photoresist layer 12 is then removed, and a blanket insulator layer 14, for example Si$_x$N$_y$, with an approximate thickness of 0.2 micron is deposited thereon. Using directional RIE etching using CF$_4$, the insulating Si$_x$N$_y$ layer 14 is then etched to form insulator sidewalls 14 with substantially vertical walls 44. The structure at this stage of the process is as shown in FIG. 1C.

The SiO$_x$ layer 10 is now removed preferably by wet etching with buffered HF. The GaAs layer 8 beneath is then removed by RIE with CCl$_2$F$_2$ and He using AlGaAs layer 6 as an etch stop. Using insulator sidewalls 14 as a mask, AlGaAs layer 6 is preferably removed by RIE with BCL$_3$, thereby exposing the substantially vertical inner walls 45 of insulator sidewalls 14 and leaving insulator sidewalls 14 free-standing (See FIG. 1D). Insulator sidewalls 14 facilitate the creation of mirror facets 13 for heterostructure laser diode 1 which is described next.

In accordance with the preferred embodiment, a diode laser 1 is then formed in the region 15 between insulator sidewalls 14. Mirror facets 13 for diode laser 1 being formed essentially simultaneously with the formation of laser diode 1, at the interface of insulator sidewalls 14 and diode laser 1 along vertical inner walls 45.

Figure 1D:
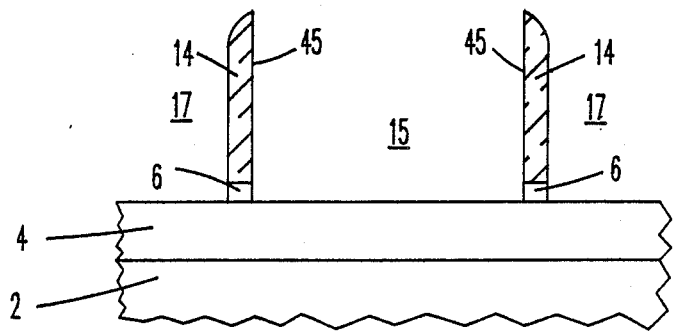

Referring to FIG. 1E for the detailed formation of mirror facets 13 and diode laser 1, AlGaAs layer 16 with a preferred n-type, silicon dopant concentration of about $5E17$ cm$^{-3}$ and an approximate thickness of about 1.5 micron is deposited by MOCVD selectively in region 15 and 17 (FIG. 1D). An active layer 18 of GaAs with a preferred p-type, zinc dopant concentration of approximately $1E17$ cm$^{-3}$ and a thickness of about 0.25 micron is deposited on top of layer 16. This is followed by an AlGaAs layer 20 with a preferred p-type, zinc dopant concentration of about $5E17$ cm$^{-3}$ and a thickness of about 1.5 micron. GaAs layer 22 having a preferred p-type, zinc dopant concentration of $5E19$ cm$^{-3}$ and a preferred thickness of about 0.1 micron follows to complete the laser diode heterostructure 1.

As can be seen, with the deposition of active layer 18, mirror facets 13 are essentially formed simultaneously in situ therewith, along vertical inner walls 45. It should be appreciated that mirror facets 13 are formed essentially immediately following the removal of mandrel 9. As a result, the vertical inner walls 45 and mirror facets 13 are substantially free from contaminants which could otherwise be introduced by any intervening intermediate processing steps. Further, the thickness of insulator sidewalls 14 is preferably about one half of the wavelength of the emitted light of laser diode 1. As such, laser diode 1 with mirror facets 13 formed in situ in accordance with the present novel process results in a compact overall structure.

To mask off laser diode heterostructure 1 and mirror facets 13, a Si$_x$N$_y$ layer 24 is deposited by PECVD. Si$_x$N$_y$ layer 24 is patterned by conventional photomasking and etched using CF$_4$ leaving Si$_x$N$_y$ portion 46 covering laser diode 1 and mirror facets 14 as illustrated in FIG. 1F. Using Si$_x$N$_y$ portion 46 as a mask, exposed portions of layers 16, 18, 20, and 22 are preferably removed by BCl$_3$ plasma etching, leaving GaAs layer 4 uncovered as illustrated in FIG. 1G. Contacts to the laser device 1 are made through the GaAs layer 4 and by patterning and etching through the Si$_x$N$_y$ portion 46 and depositing a p contact metallurgy, e.g., titanium/platinum/gold.

With the laser device 1 masked off, other optoelectronic devices performing different functions, such as laser drivers using heterostructure bipolar transistors (HBT's), optical waveguides, and logic circuits could be fabricated horizontally alongside laser device 1 in a monolithically integrated manner on semi-insulating substrate 2, above the n-doped GaAs layer 4. More particularly, GaAs layer 26 with an n-type dopant concentration of about $2E18$ cm$^{-3}$ and a preferred thickness of about 1.3 microns is selectively deposited alongside the region of laser device 1 by MOCVD, thereby ensuring a final planar wafer surface. Al$_x$Ga$_{1-x}$As layer 28 with an x value of about 0.3 and a thickness of approximately 0.4 microns is deposited selectively on layer 26. Layer 28 is tailored with desirable optical characteristics to function as an optical waveguide for the coherent optical output from laser device 1 by way of mirror facets 13. The characteristics of layer 28 would be dependent on the particular application. For instance, for coupling the laser device 1 output to a fiber optic, the dimensions and composition of layer 28 should be such as to maximize the light coupling efficiency to the particular fiber optic cross section. For such application, layer 28 is preferably n-doped and has a higher index of refraction than that of its surrounding layers. Layers 30, 32, 34, 36, and 38 could then be selectively deposited by MOCVD in accordance with known process definition to form heterostructure bipolar transistors horizontally alongside laser diode 1 and connected to function as laser device drivers and logic circuits (not shown). For known processes for making HBT's, see for example, J. Shibata, et al, hereinabove; and an article entitled, "Transport and Related Properties of (Ga,Al)As/GaAs Double Heterostructure Bipolar Junction Transistors", by S. Tiwari, et al, RC 11792, (1986), IBM Thomas J. Watson Research Center.

The process in accordance with the invention lead to a semiconductor chip having a planar wafer surface as illustrated in FIG. 1H and having thereon monolithically integrated laser device 1 with mirror facets 13 formed in situ, waveguides, laser drivers, logic and other electronic circuits.

In summary, large scale integration (LSI) chips having multifunctions, including laser structures, waveguides, other optical devices, laser drivers, logic and other electronic circuits could be made in accordance with the present invention. Such multi-function LSI chips offer higher performance and greater economy.

Although for the purpose of a clear explanation and illustration of the present invention, a single isolated laser structure has been illustrated and described in details hereinabove. It is understood by one of ordinary skill in this art, from the suggestions and illustrations hereinabove, that a multitude of such laser structure could be fabricated simultaneously, and that such laser structures could be arranged with other optical devices, electronic circuits and functions to produce a useful optoelectronic chip incorporating the essence of the present invention.

While Applicants' preferred embodiment for their invention is shown and described utilizing gallium arsenide, it is clear that other alternatives, for example, other III–V compounds, may also be applicable.

Although the above-described pattern-defining steps in FIGs. 1A–1H are shown and described in terms of conventional photolithographic techniques, it is to be understood that other lithographic techniques, such as electron beam lithography and/or x-ray lithography may be employed to define the patterns in the present disclosed method without deviating from the scope and spirit of the present invention.

From the preceding detailed description of Applicants' invention, it is seen that optoelectronic devices fabricated using the method in accordance with the present invention have advantageous heretofore not possible to achieve. In addition to the variations and modifications of Applicants' disclosed method, which have been suggested, many other variations and modifications will be apparent to those of ordinary skill in this art, and accordingly, the scope of Applicants' invention is not to be construed to the particular embodiments shown or suggested.

We claim:

1. A process for forming laser diode mirror facets comprising the steps of:
   providing a semi-insulating substrate having a first epitaxial layer of a first type conductivity overlying said substrate, a second epitaxial layer of said first conductance type overlying said first epitaxial layer and a third undoped epitaxial layer overlying said second epitaxial layer;
   patterning and etching said third undoped epitaxial layer into a mandrel having substantially vertical walls;
   establishing insulator sidewalls on said vertical walls;
   removing said mandrel, thereby exposing inner walls of said insulator sidewalls and leaving said insulator sidewalls self-standing;
   removing said second epitaxial layer using said insulator sidewalls as a mask; and
   forming a laser diode overlying said first epitaxial layer within the region between said insulator sidewalls, thereby creating said mirror facets at the interface of said laser diode and said insulator sidewalls.

2. A process for forming laser diode mirror facets as set forth in claim 1, wherein said first epitaxial layer is GaAs.

3. A process for forming laser diode mirror facets as set forth in claim 2, wherein said second epitaxial layer is AlGaAs.

4. A process for forming laser diode mirror facets as set forth in claim 3, wherein said third undoped epitaxial layer is GaAs.

5. A process for forming laser diode mirror facets as set forth in claim 1, wherein side insulator sidewalls are established by depositing a blanket silicon nitride layer covering said mandrel and etching said silicon nitride layer using reactive ion etching.

6. A process for forming laser diode mirror facets as set forth in claim 1, wherein said first epitaxial layer, second epitaxial layer, said third epitaxial layer and said laser diode are formed by metalorganic chemical vapor deposition.

7. A process for fabricating a heterostructure laser having mirror facets comprising the steps of:
   providing a semi-insulating substrate having a first epitaxial layer of a first type conductivity overlying said substrate, a second epitaxial layer of said first conductance type overlying said first epitaxial layer and a third undoped epitaxial layer overlying said second epitaxial layer;
   patterning and etching said third undoped epitaxial layer into a mandrel having substantially vertical walls;
   establishing insulator sidewalls on said vertical walls;
   removing said mandrel, thereby exposing inner walls of said insulator sidewalls and leaving said insulator sidewalls self-standing;
   removing said second epitaxial layer using said insulator sidewalls as a mask; and
   forming said heterostructural laser overlying said first epitaxial layer within the region between said insulator sidewalls, thereby creating said mirror facets at the interface of said heterostructure laser and said insulator side-walls.

8. A process for fabricating a heterostructure laser as set forth in claim 7, wherein said first epitaxial layer is GaAs.

9. A process for fabricating a heterostructure laser as set forth in claim 8, wherein said second epitaxial layer is AlGaAs.

10. A process for fabricating a heterostructure laser as set forth in claim 9, wherein said third undoped epitaxial layer is GaAs.

11. A process for fabricating a heterostructure laser as set forth in claim 7, wherein side insulator sidewalls are established by depositing a blanket silicon nitride layer covering said mandrel and etching said silicon nitride layer using reactive ion etching.

12. A process for fabricating a heterostructure laser as set forth in claim 7, wherein said first epitaxial layer, second epitaxial layer, said third epitaxial layer and said heterostructure laser are formed by metalorganic chemical vapor deposition.

13. A planar process for fabricating an optoelectronic integrated circuit device comprising the steps of:
providing a semi-insulating substrate having a first epitaxial layer of a first type conductivity overlying said substrate, a second epitaxial layer of said first conductance type overlying said first epitaxial layer and a third undoped epitaxial layer overlying said second epitaxial layer;
patterning and etching said third undoped epitaxial layer into a mandrel having substantially vertical walls;
establishing insulator sidewalls on said vertical walls;
removing said mandrel, thereby exposing inner walls of said insulator sidewalls and leaving said insulator sidewalls self-standing;
removing said second epitaxial layer using said insulator sidewalls as a mask;
forming a heterostructural laser overlying said first epitaxial layer within the region between said insulator sidewalls, thereby creating said mirror facets at the interface of said heterostructural laser and said insulator sidewalls; and
forming other optoelectronic devices along side said heterostructure laser, said other optoelectronic devices having upper surfaces substantially coplanar with the upper surface of said heterostructure laser.

14. A process for fabricating an optoelectronic integrated circuit device as set forth in claim 13, wherein said first epitaxial layer is GaAs.

15. A process for fabricating an optoelectronic integrated circuit device as set forth in claim 14, wherein said second epitaxial layer is AlGaAs.

16. A process for fabricating an optoelectronic integrated circuit device as set forth in claim 15, wherein said third undoped epitaxial layer is GaAs.

17. A process for fabricating an optoelectronic integrated circuit device as set forth in claim 13, wherein side insulator sidewalls are established by depositing a blanket silicon nitride layer covering said mandrel and etching said silicon nitride layer using reactive ion etching.

18. A process for fabricating an optoelectronic integrated circuit device as set forth in claim 13, wherein said first epitaxial layer, second epitaxial layer, said third epitaxial layer and said heterostructure laser are formed by metalorganic chemical vapor deposition.

19. A process for fabricating an optoelectronic integrated circuit device as set forth in claim 13, wherein said forming of other optoelectronic devices includes the formation of an optical waveguide.

20. A process for fabricating an optoelectronic integrated circuit device as set forth in claim 13, wherein said forming of other optoelectronic devices includes the formation of heterostructure bipolar transistors.

* * * * *